United States Patent
Kline et al.

(10) Patent No.: US 8,432,034 B2
(45) Date of Patent: Apr. 30, 2013

(54) USE OF A LOCAL CONSTRAINT TO ENHANCE ATTACHMENT OF AN IC DEVICE TO A MOUNTING PLATFORM

(75) Inventors: Eric Vance Kline, Rochester, MN (US); Michael Robert Rasmussen, Mazeppa, MN (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 13/115,545

(22) Filed: May 25, 2011

(65) Prior Publication Data

US 2012/0299201 A1    Nov. 29, 2012

(51) Int. Cl.
  *H01L 23/48* (2006.01)
  *H01L 21/00* (2006.01)
(52) U.S. Cl.
  USPC .... 257/738; 257/774; 257/779; 257/E23.021; 257/E23.069; 438/108
(58) Field of Classification Search .................. None
  See application file for complete search history.

(56) References Cited

U.S. PATENT DOCUMENTS

| | | | |
|---|---|---|---|
| 5,148,266 A | 9/1992 | Khandros et al. | |
| 5,859,470 A * | 1/1999 | Ellerson et al. | 257/772 |
| 5,972,734 A | 10/1999 | Carichner et al. | |
| 6,191,952 B1 * | 2/2001 | Jimarez et al. | 361/771 |
| 6,204,563 B1 * | 3/2001 | Ohuchi et al. | 257/778 |
| 6,226,793 B1 | 5/2001 | Kwoh | |
| 6,429,516 B1 | 8/2002 | Tsunoi | |
| 6,441,473 B1 | 8/2002 | Deshmukh | |
| 6,458,623 B1 * | 10/2002 | Goldmann et al. | 438/107 |
| 6,756,253 B1 | 6/2004 | Farnworth et al. | |
| 6,882,049 B2 | 4/2005 | Grigg | |
| 7,061,122 B2 | 6/2006 | Kim et al. | |
| 7,170,171 B2 | 1/2007 | Grigg | |
| 7,173,325 B2 | 2/2007 | Vasoya et al. | |
| 7,230,339 B2 | 6/2007 | Key et al. | |
| 7,380,258 B2 | 5/2008 | Durden et al. | |
| 7,489,518 B2 | 2/2009 | Matsuda | |

(Continued)

OTHER PUBLICATIONS

Chiang et al., "Parametric Reliability Analysis of No-Underfill Flip Chip Package", IEEE Transactions on Components and Packaging Technologies, vol. 24, No. 4, Dec. 2001, pp. 635-640.

(Continued)

*Primary Examiner* — Alonzo Chambliss
(74) *Attorney, Agent, or Firm* — Yee & Associates, P.C.; David A. Mims, Jr.

(57) ABSTRACT

An embodiment is directed to an IC mounting assembly that comprises an IC device having a first planar surface, wherein multiple electrically conductive first terminals are located at the first surface. The assembly further comprises an IC device mounting platform having a second planar surface in closely spaced relationship with the first surface, wherein multiple electrically conductive second terminals are located at the second surface, each second terminal corresponding to one of the first terminals. A solder element extends between each first terminal and its corresponding second terminal, and a constraining element is fixably joined to the second surface, wherein the constraining element has a CTE which is selectively less than the CTE of the mounting platform at the second surface. The constraining element is provided with a number of holes or apertures, and each hole is traversed by a solder element that extends between a first terminal and its corresponding second terminal.

20 Claims, 8 Drawing Sheets

U.S. PATENT DOCUMENTS

| | | | |
|---|---|---|---|
| 2002/0059588 A1 | 5/2002 | Huber et al. | |
| 2005/0257242 A1 | 11/2005 | Montgomery et al. | |
| 2007/0132078 A1* | 6/2007 | Matsumoto | 257/678 |
| 2008/0261353 A1* | 10/2008 | Matsumoto | 438/127 |
| 2010/0131993 A1 | 5/2010 | Sanitate et al. | |

OTHER PUBLICATIONS

"Variable Rating-Based Playback of Audio/Video Content", IBM Technical Disclosure Bulletin, IPCOM000015940D, May 19, 2002, pp. 1-4.

* cited by examiner

USE OF A LOCAL CONSTRAINT TO ENHANCE ATTACHMENT OF AN IC DEVICE TO A MOUNTING PLATFORM

BACKGROUND OF THE INVENTION

1. Field of the Invention

The invention disclosed and claimed herein generally pertains to an apparatus and method for using a local constraint to enhance attachment of an IC package, chip or other device to a PCB or other mounting platform, when a BGA or the like is used for the attachment. More particularly, the invention pertains to an apparatus and method of the above type which eliminates the need to underfill the IC package, chip or device, after it has been soldered to the PCB or other platform.

2. Description of the Related Art

It has become quite common to use ball grid arrays (BGAs) and micro BGAs (C4s) to attach IC packages, chips and other IC devices to printed circuit boards (PCBs) or other platforms. A BGA comprises multiple balls of solder, which are typically joined to electrically conductive pads or terminals along a planar surface of the IC package or other device. The IC device and BGA are placed onto a PCB, so that respective solder balls of the BGA are in contact with corresponding conductive pads of the PCB substrate. This configuration is then heated, such as by means of a reflow oven, so that the solder balls melt. Thereafter, the solder is cooled and solidifies, and thus bonds the package or device to the PCB.

Notwithstanding the benefits of BGAs for surface mount attachment of IC devices, as described above, this means of attachment also has a significant drawback. Because the soldering process requires a heating phase followed by a cooling phase, both the IC device and the PCB substrate experience thermal expansion and thermal contraction. However, it is common for the coefficient of thermal expansion (CTE) of the IC device attached by the BGA to be different from the CTE of the PCB substrate, and to typically be quite less. This difference can cause the solder balls to deform, and may stress the solder joints to such an extent that the joints break or fracture.

At present, this problem is addressed by means of a practice referred to as underfilling. Underfilling is used, for example, in connection with IC devices that are high performance, high I/O count devices. In an underfilling process, after a BGA has been used to solder an IC device to a PCB as described above, an underfill (which could be an epoxy) mixture is injected between the IC device and the PCB. The device is thus glued to the PCB surface and rigidly held in place with respect thereto. However, a serious disadvantage with refilling is that if it becomes necessary to rework the BGA connections, any such rework effort will be difficult or impossible.

SUMMARY OF THE INVENTION

In embodiments of the invention, an IC package or chip is attached to the surface of a PCB or other mounting platform by means of solder elements such as the balls of a BGA. A constraining element is rigidly bonded to the PCB surface by means of epoxy or like adhesive, proximate to the joints between the solder elements and the PCB surface. The constraining element has substantial mechanical strength, and also has a low or negative CTE. When the above assembly is heated or cooled, the constraining element acts to oppose or constrain thermal expansion and contraction of the PCB. By configuring the constraining element to interact with the PCB to achieve a resultant CTE that approximates the CTE of the IC device, over-stressing leading to fracturing or compromise of the solder joints may be prevented, and solder joint (i.e., assembly operational) life may be improved.

One embodiment of the invention is directed to an IC mounting assembly that comprises an IC device having a first planar surface, wherein multiple electrically conductive first terminals are located at the first surface. The assembly further comprises an IC device mounting platform having a second planar surface in closely spaced relationship with the first surface, wherein multiple electrically conductive second terminals are located at the second surface, each second terminal corresponding to one of the first terminals. A solder element extends between each first terminal and its corresponding second terminal, and a constraining element is fixably joined to the second surface, wherein the constraining element has a CTE which is selectively less than the CTE of the mounting platform at the second surface. The constraining element is provided with a number of holes or apertures, and each hole is traversed by a solder element that extends between a first terminal and its corresponding second terminal.

DETAILED DESCRIPTION OF THE EMBODIMENT

Figure 1:
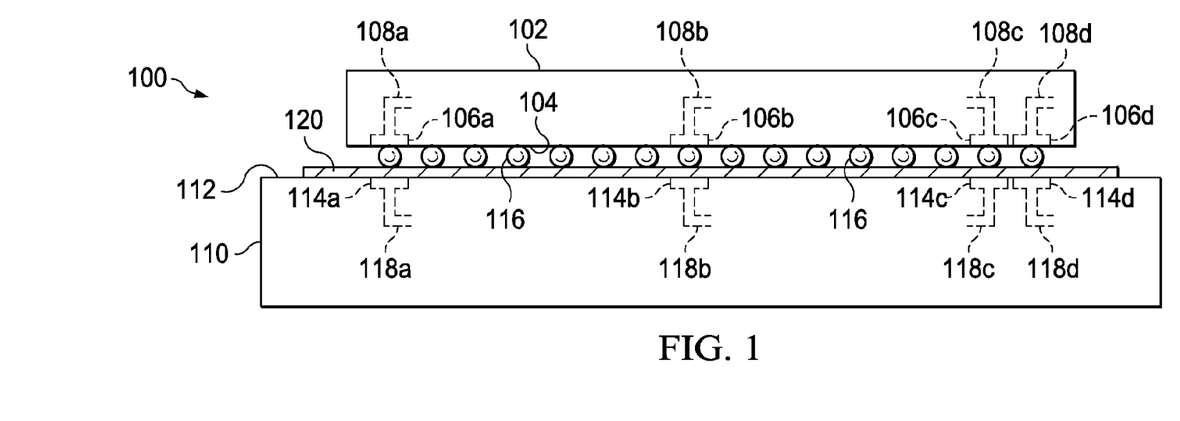
FIG. 1 is a block diagram showing respective components of an embodiment of the invention.

Referring to FIG. 1, there is shown an embodiment of the invention comprising an assembly 100 which includes an IC device 102, such as an IC chip, package, or the like of a currently used type. IC device 102 has a number of electrically conductive terminals, pads, or contact points which are located at and accessible from a substantially planar surface 104 of IC device 102. The terminals or pads are represented in FIG. 1 by exemplary terminals 106a-106d, although there typically would be many more than four of such terminals. Conductive interconnects 108a-d extend between terminals 106a-d, respectively, and various components (not shown) within IC device 102, to enable electrical transmissions between respective terminals and components.

Referring further to FIG. 1, there is shown a PCB 110, or other modular carrier or mounting platform for receiving and supporting IC chips, packages, or devices such as IC device 102. PCB 110 has a substantially planar surface or substrate 112, which is positioned in close parallel relationship with surface 104 of IC device 102. PCB 110 has a number of electrically conductive terminals or pads which are located at and accessible from the surface 112. These terminals or pads are represented in FIG. 1 by exemplary terminals 114a-d.

In embodiments of the invention, there typically will be one terminal or pad such as terminals 114a-d corresponding to each of the terminals located at the surface 104 of IC device 102. Moreover, when PCB 110 is positioned in an intended relationship with IC device 102, each terminal of PCB 110 will be in closely spaced relationship with its corresponding terminal of device 102. Thus, FIG. 1 shows terminals or pads 114a-114d of PCB 110 in closely spaced relationship with terminals 106a-d, respectively, of IC device 102. FIG. 1 further shows conductive interconnects 118a-d coupled to PCB terminals 114a-d, respectively, to provide paths for electrical transmission with other components (not shown).

FIG. 1 further shows an arrangement of solder balls 116, not all of which are referenced by number, that collectively comprise a ball grid array (BGA). The balls of the BGA are initially attached to respective terminals located at surface 104 of IC device 102. Also, the terminals or pads at surface 112 of PCB 110 are arranged in a pattern that matches the arrangement of the solder balls 116 of the BGA. The solder balls are placed on respective terminals of PCB 110, and the assembly is heated, such as in a reflow oven or other known method, to melt the solder balls. The solder balls then cool and solidify, to firmly join IC device 102 to PCB 110, and to thereby form or construct assembly 100.

In accordance with embodiments of the invention, FIG. 1 further shows a constraining element 120, which is placed on surface 112 of PCB 110, proximate to the solder joints between respective BGA balls 116 and their corresponding PCB terminals. Constraining element 120 and its operation are described hereinafter in further detail.

Figure 2:
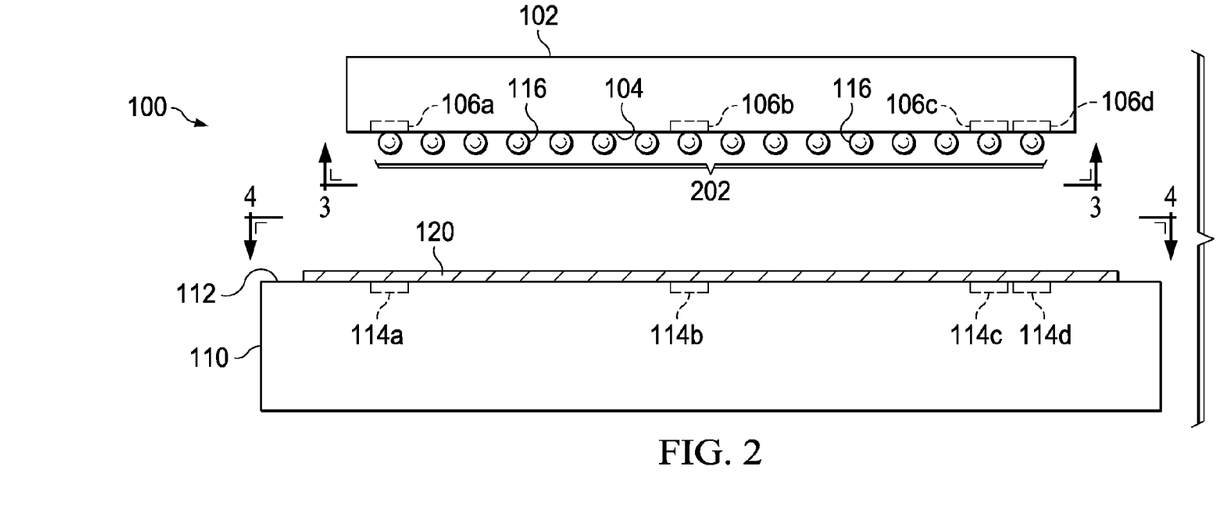
FIG. 2 is an exploded block diagram, wherein an IC device and BGA of FIG. 1 are shown spaced apart from other elements thereof.

Referring to FIG. 2, there is shown assembly 100 wherein the IC device 102 and BGA components are spaced apart from the PCB 110 and constraining element 120. FIG. 2 is provided to enhance understanding of the subject matter which is depicted in FIGS. 3 and 4, respectively.

Figure 3:
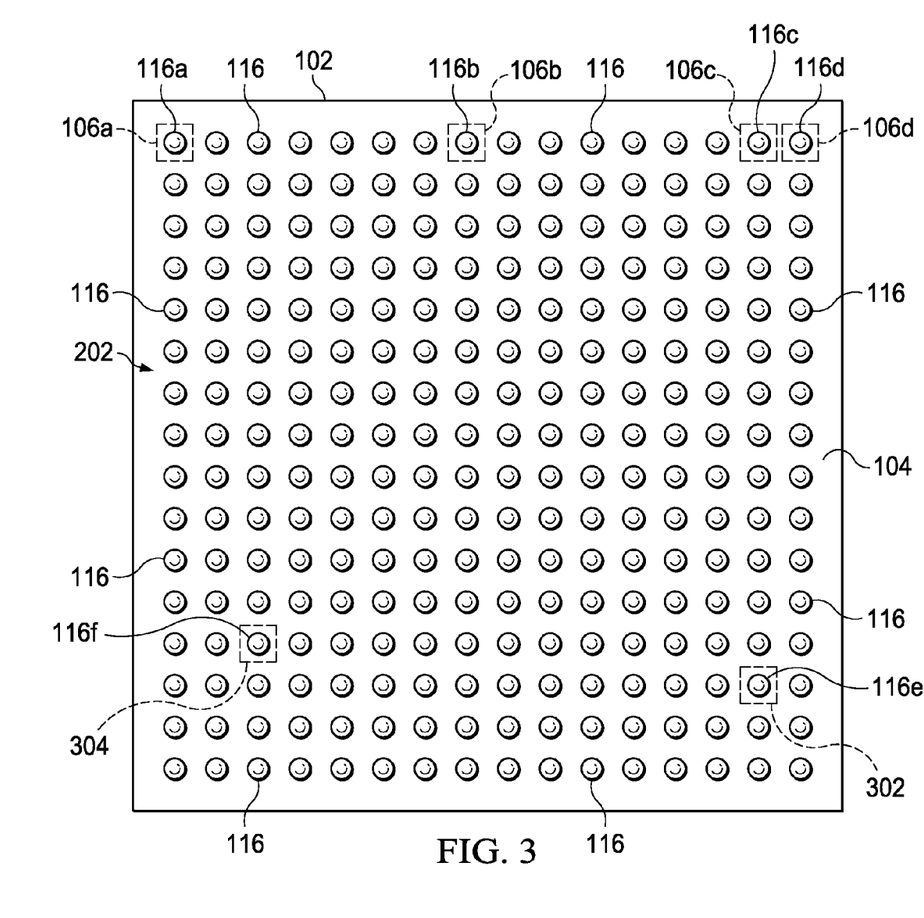
FIG. 3 is a view taken along lines 3-3 of FIG. 2.

Referring to FIG. 3, there is shown IC device 102 with the BGA described above attached to planar surface 104. Such BGA comprises exemplary solder balls 116, together with a large number of additional balls which are not individually numbered for convenience. All these balls together are collectively referenced in FIG. 3 as BGA 202.

By way of illustration, FIG. 3 shows respective balls of BGA 202 arranged as a 16×16 matrix. However, it is to be emphasized that virtually any pattern and reasonable number of solder balls could be used, in order to match a particular arrangement of terminals on IC device 102 and on PCB 110. FIG. 3 shows exemplary terminals 106a-d, as well as further exemplary terminals 302 and 304, located at surface 104 of IC device 102. BGA solder balls 116a-f are in electrical contact with terminals 106a-d, 302, and 304, respectively.

Figure 4:
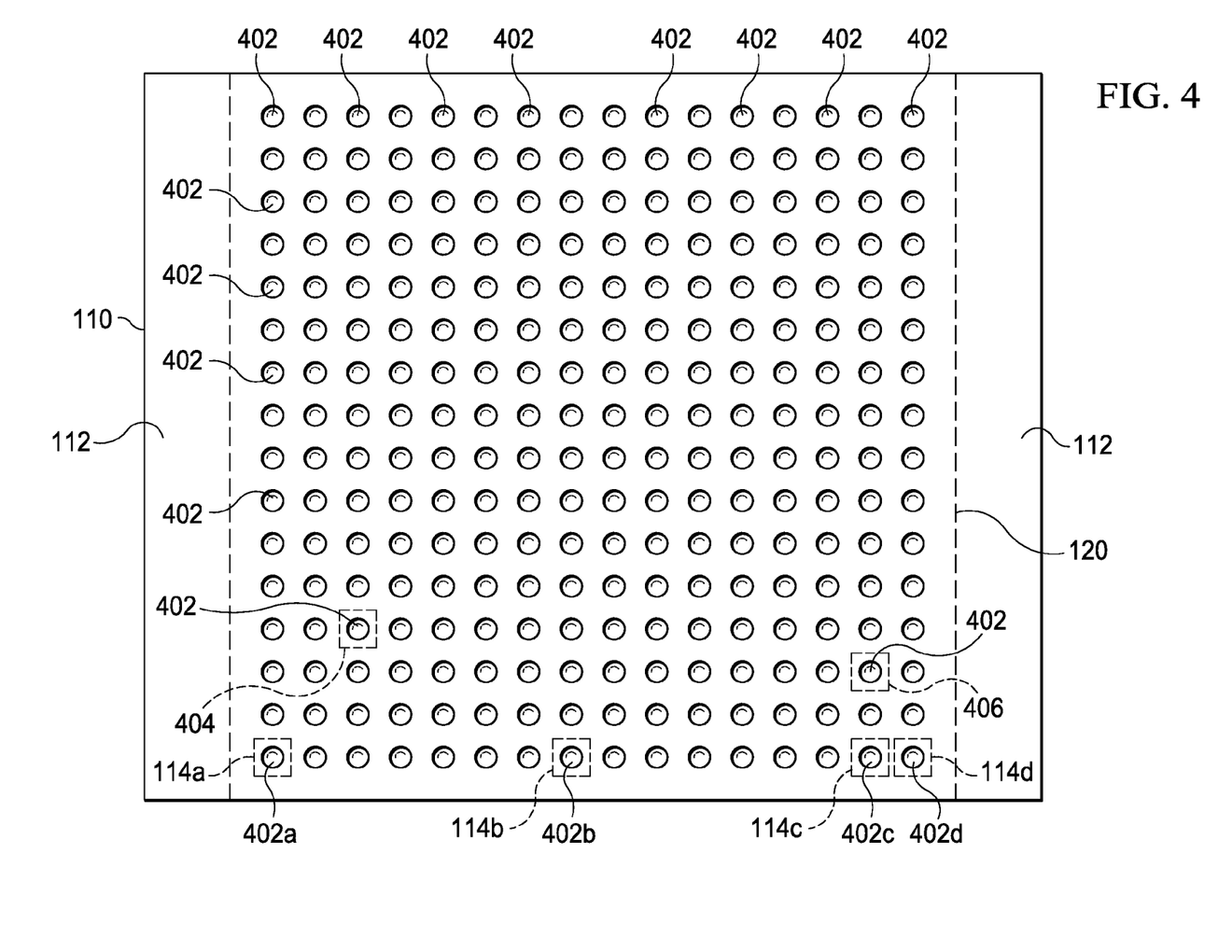
FIG. 4 is a view taken along lines 4-4 of FIG. 2.

Referring to FIG. 4, there is shown constraining element 120, which comprises a sheet of carefully selected material of selected thickness. Constraining element 120 is very rigidly or fixably joined to a portion of the surface 112 of PCB 110, such as by means of an epoxy or other suitable adhesive. As an essential feature of embodiments of the invention, constraining element 120 must be formed of a material that has substantial mechanical strength, and that also has a low or negative coefficient of thermal expansion (CTE). It is to be appreciated that constraining element 120 is sufficiently thin, so that it does not interfere with assembly of IC device 102 to PCB 110. By way of example and not limitation, materials that could be used to fabricate constraining element 120 include invar, tungsten, molybdenum, kevlar, and several alloys of iron, nickel, and cobalt. Invar has a CTE of −4.8 to 2.0 ppm/° C.; tungsten has a CTE of 2.5 to 2.6 ppm/° C.; molybdenum has a CTE of 2.0 to 4.8 ppm/° C.; and kevlar has a CTE of −6.3 to 10.0 ppm/V.

Referring further to FIG. 4, it is seen that the sheet of material which comprises constraining element 120 has a pattern of holes, apertures, or perforations 402 formed therethrough. This pattern of holes 402 is configured to exactly match the pattern or arrangement of the solder balls 116 of BGA 202. Thus, the pattern of holes formed through constraining element 120 shown in FIG. 4 comprises a 16×16 matrix of the holes 402. Different patterns of holes would, of course, be used with different BGA patterns.

Moreover, each BGA ball 116 has a hole 402 positioned to correspond to it. Thus, when BGA 202 and IC device 102 are placed upon PCB 110, as shown in FIG. 1, each ball 116 passes through its corresponding hole 402 of the constraining element 120, and into contact with a terminal at surface 112 of PCB 110. For example, the solder balls 116a-d of FIG. 3, in contact with respective terminals 106a-d of device 102, would pass through constraining element holes 402a-d, respectively, and into contact with respective terminals 114a-114d of the PCB 110. Also, balls 116e-f in contact with terminals 302 and 304 would pass through holes 402 into contact with terminals 406 and 404, respectively, of PCB 110.

As an additional feature of constraining element 120, the size of respective holes 402 is made larger than the outer dimensions of their respectively corresponding BGA solder balls 116, to provide substantial clearance therebetween. This prevents electrical contact between the balls and constraining element 120, when the balls are inserted through their respective holes 402.

Figure 5:
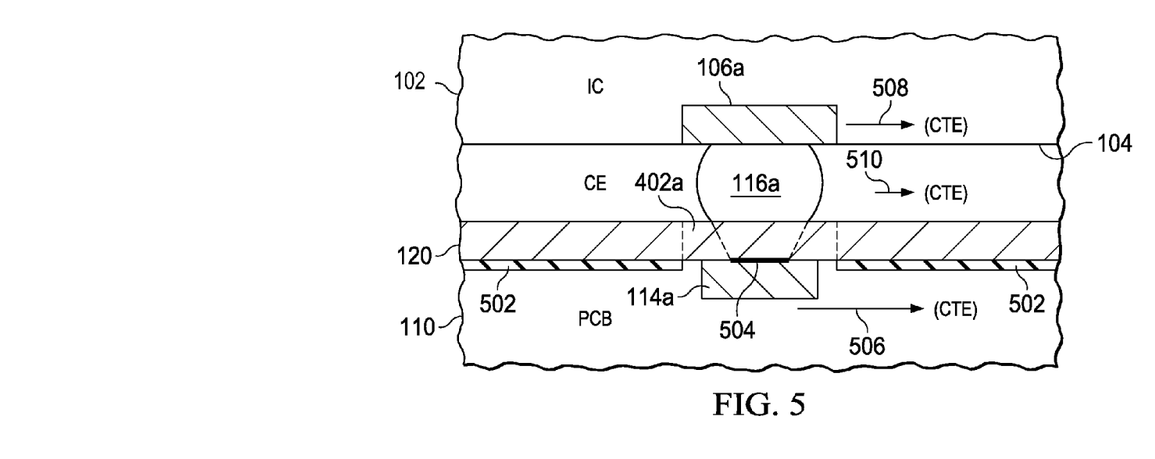
FIG. 5 is a schematic sectional view showing selected components of FIG. 1 in further detail.

Referring to FIG. 5, there is shown a schematic sectional view of selected components of FIG. 1, which is provided to illustrate certain features and operating principles of embodiments of the invention. FIG. 5 more particularly shows solder ball 116a of the BGA 202 extending between terminal 106a of IC device 102, and terminal 114a of PCB 110. Ball 116a thus traverses hole 402a formed through constraining element 120. FIG. 5 further shows constraining element 120 tightly bonded to surface 112 of PCB 110 by means of a suitable adhesive 502, such as epoxy or the like.

As described above, respective components of assembly 100 including those shown in FIG. 5 are selectively heated and then cooled, in order to form a solder joint 504 that firmly bonds solder element 116a to PCB terminal 114a. However, IC device 102 has a CTE value $(CTE)_{IC}$ and PCB 110 has a CTE value $(CTE)_{PCB}$, wherein $(CTE)_{PCB}$ is significantly greater than $(CTE)_{IC}$. As stated above, this is a common situation. For example, $(CTE)_{IC}$ could be on the order of 9 ppm. PC and $(CTE)_{PCB}$ could be on the order of 19 ppm./° C.

During the above cooling phase of the assembly soldering process, i.e., post solidification of liquid solder into a solder joint, this difference between CTE values will cause substantial stress to be produced within the solder joint 116, PCB 110 and IC device 102. FIG. 5 shows an arrow 506 that represents the amount of stress that would be applied to terminal 114a of PCB 110, during the cooling phase of the soldering process, in the absence of constraining element 120. An arrow 508 represents the amount of stress applied to terminal 106a of IC device 102 during the same phase.

As previously described, the difference in CTEs cause stress between terminals 114a and 106a, and could cause the solder joint 504 to be weakened, compromised, or broken. In order to prevent this, constraining element 120 is rigidly bonded to PCB 110 as described above. As likewise described above, the CTE value $(CTE)_{CE}$ of constraining element 120 is selected to be much less than the CTE value of PCB 110.

Thus, the associated stress is also much less, as indicated by arrow 510 of FIG. 5. As also previously described, the material used for constraining element 120 is selected to have substantial mechanical strength.

Accordingly, when the combined structure of PCB 110 and constraining element 120 is cooled during the solder cooling phase, thermal contraction of PCB 110, adjacent to surface 112 and terminal 114a, is opposed or constrained by the much more limited contraction of constraining element 120. If $(CTE)_{CE}$ was a negative value, constraining element 120 would tend to expand rather than contract in response to the cooling.

Generally, by joining constraining element 120 to surface 112 of PCB 110 as described above, the combined structure has a resultant CTE value $(CTE)_R$, which is determined from the values of both $(CTE)_{PCB}$ and $(CTE)_{CE}$. By judicious selection of the material used for constraining element 120, in order to provide a particular value for $(CTE)_{CE}$, the resultant value $(CTE)_R$ of the combined structure can achieve a significantly reduced differential with $(CTE)_{IC}$. That is, $(CTE)_R - (CTE)_{IC}$ would be significantly less than $(CTE)_{PCB} - (CTE)_{IC}$. In one useful embodiment, the resultant value $(CTE)_R$ of the combined structure would be approximately equal to the CTE value of IC device 102.

Figure 6:
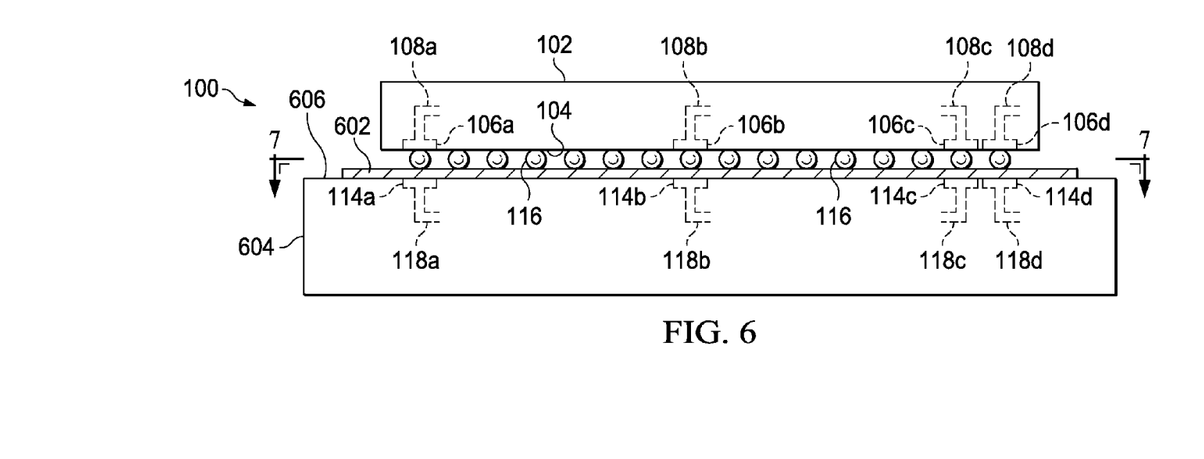
FIG. 6 is a block diagram showing a second embodiment of the invention.

Referring to FIG. 6, there is shown an embodiment of the invention that includes many of the same components as the embodiment of FIG. 1. However, the embodiment of FIG. 6 has a constraining element 602, rather than the constraining element 120 of FIG. 1. Also, the embodiment of FIG. 6 has a PCB 604 with a planar surface 606, to which constraining element 602 is bonded. Constraining element 602 is described in further detail in connection with FIG. 7.

Figure 7:
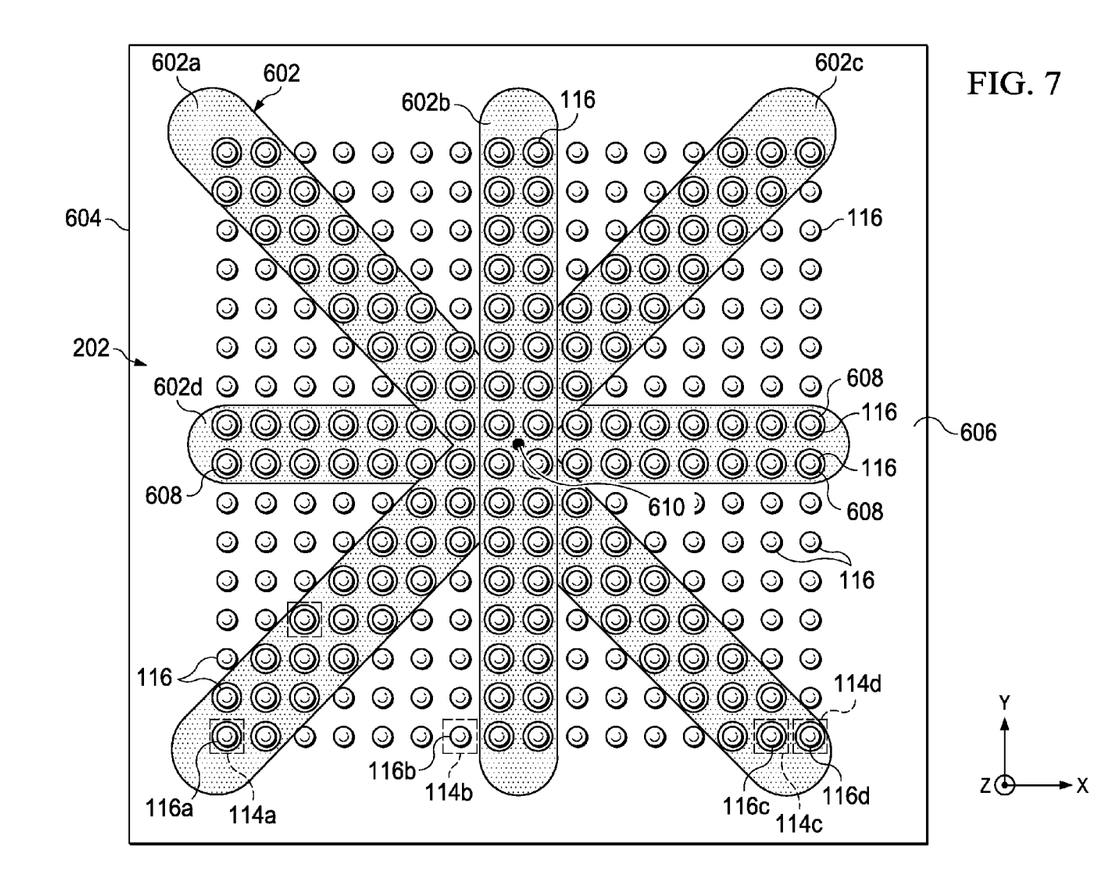
FIG. 7 is a view taken along lines 7-7 of FIG. 6.

Referring to FIG. 7, there are shown respective solder balls 116 of BGA 202 in contact with terminals or conductive pads located at surface 606 of PCB 604. Thus, FIG. 7 shows exemplary solder balls 116a-d in contact with terminals 114a-d, respectively. FIG. 7 further shows constraining element 602, which is rigidly bonded to PCB surface 606 by means of an epoxy or the like, across respective balls of BGA 202. However, the shape or configuration of constraining element 602 is very different from the rectangular configuration of constraining element 120. Constraining element 602 may be formed of the same material as constraining element 120, which has substantial mechanical strength and a low or negative CTE, as described above.

FIG. 7 shows that only some of the solder balls must pass through constraining element 602. Constraining element 602 is provided with holes or perforations 608, which are respectively positioned to accommodate such solder balls 116.

When PCB 604, the BGA matrix 202 and the IC device 102 are cooled during the soldering process, thermal action of PCB 604 creates stress at different locations of the PCB surface 606 and the BGA matrix 202. These stresses interact with one another, and the cumulative effect of the interaction results in very low stress at the center point 610 of surface 606, which is also the center of BGA 202. Stress is also very low along a neutral axis that passes through center point 610, along the Z-axis and orthogonal to the X- and Y-axes. However, the stress is very high at the edges of BGA matrix 202, and is also very high along the diagonals thereof. Thus, stress would be quite high proximate to solder balls 116a and 116d by way of example.

Referring further to FIG. 7, there is shown constraining element 602 comprising strips 602a-d, which are each centered at point 610 and are integrally joined together. As viewed in FIG. 7, constraining element strip 602a extends from the upper left corner of BGA matrix 202 to the lower right corner thereof. The strip 602c extends from the upper right corner of BGA 202 to the lower left corner thereof. Thus, constraining strips 602a and 602c lie along the diagonals of BGA 202. Constraining element strip 602b extends between opposing upper and lower edges of BGA 202. Strip 602d is orthogonal to strip 602d, and extends between opposing left and right edges of BGA 202.

By placing constraining element strips 602a and 602c along the diagonals of BGA 202, the strips are positioned to oppose or constrain stress at the highest stress locations of PCB surface 606. Opposition to stress is further enhanced by orthogonal constraining strips 602b and 602d, which respectively extend between opposing edges of the matrix of BGA 202.

As described above, the constraining element material is mechanically strong, and has a CTE that is much less than the CTE of PCB 604. Accordingly, constraining element 602 interacts with PCB 604 to provide a significantly reduced resultant CTE at locations of PCB surface 606 with which the strips of constraining element 602 are in contact. As with the embodiment of FIG. 1, constraining element 602 is usefully configured so that the resultant CTE value of a structure comprising constraining element 602 and PCB 604 is approximately equal to the CTE value of IC device 102.

A benefit of constraining element 602 is that significantly less material is needed to fabricate this element, than is needed for certain other designs.

Figure 8:
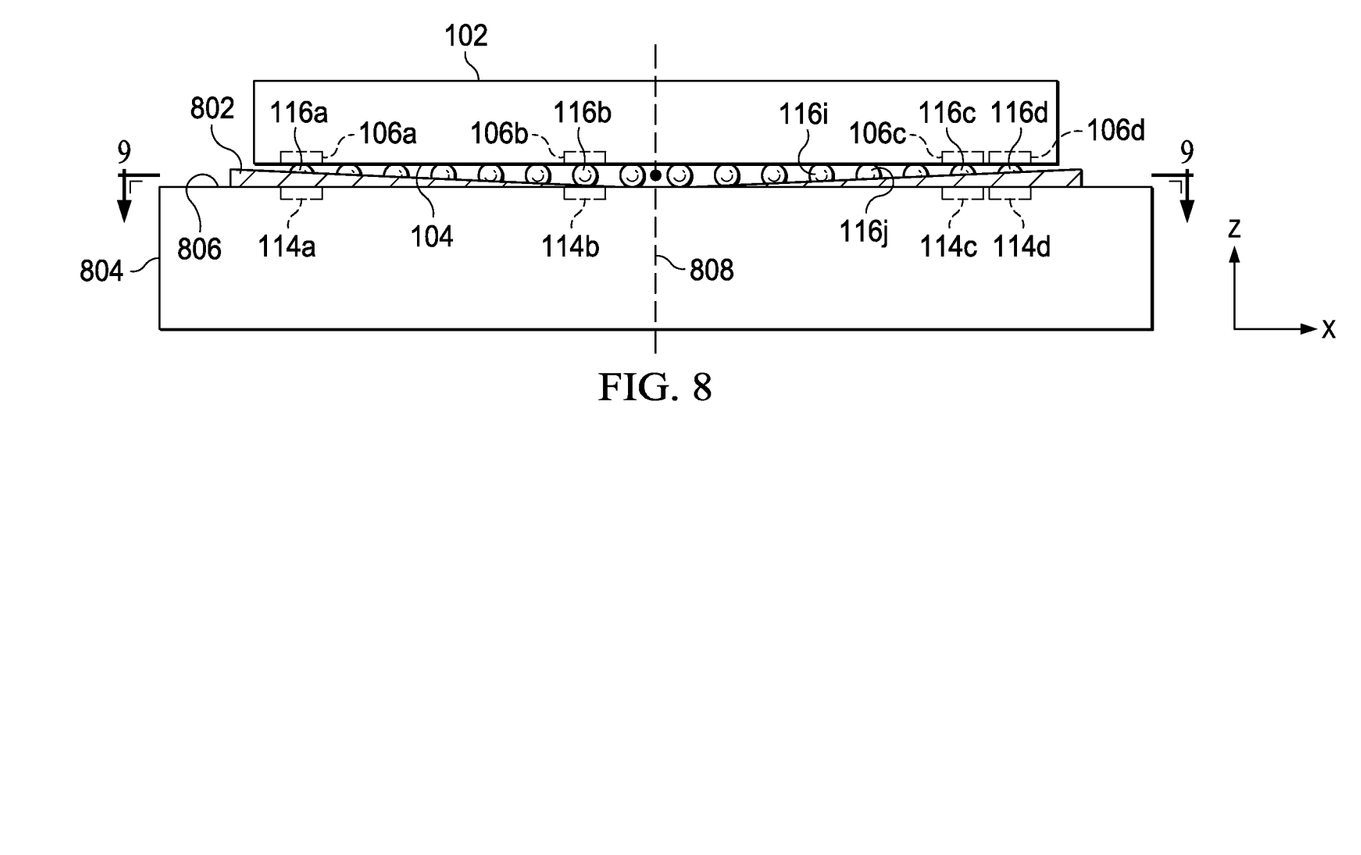
FIG. 8 is a block diagram showing a third embodiment of the invention.
Figure 9:
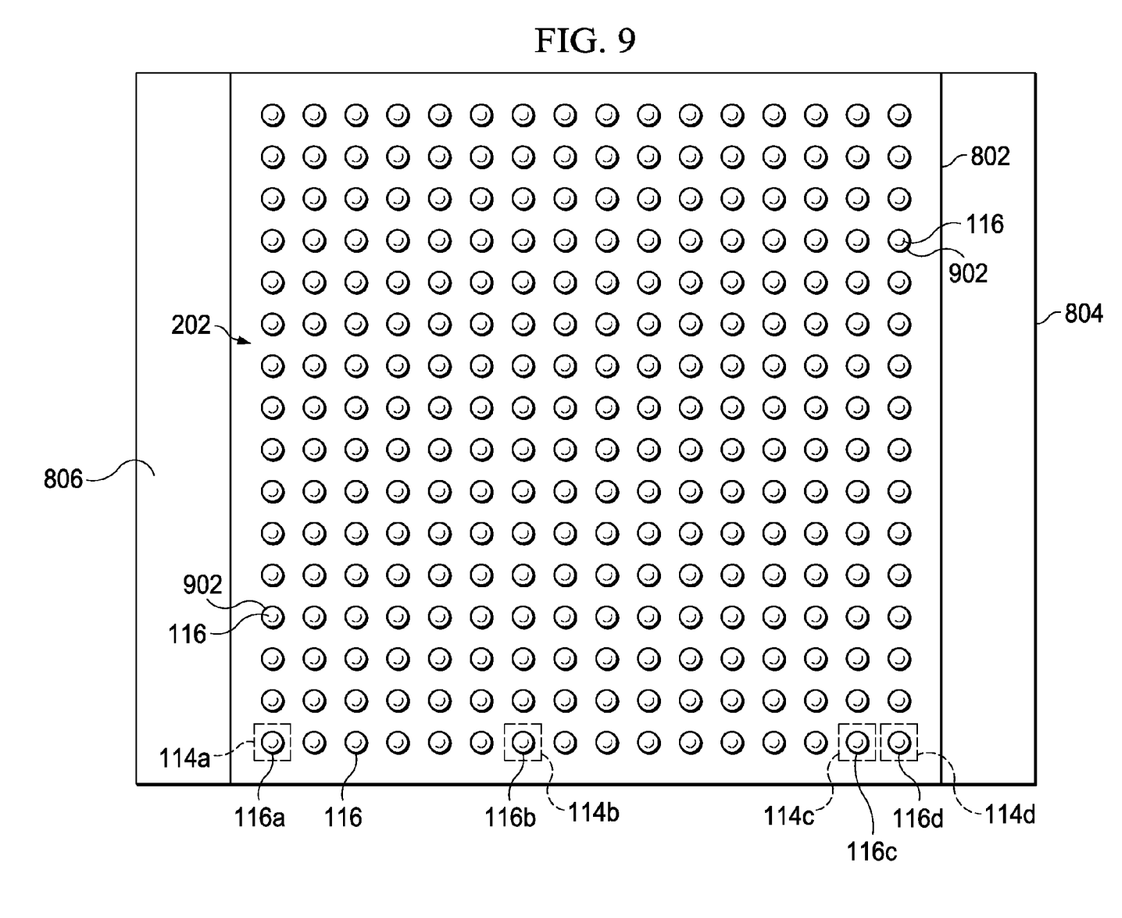
FIG. 9 is a view taken along lines 9-9 of FIG. 8.

Referring to FIGS. 8 and 9 together, there is shown an embodiment of the invention that includes many of the same components as the embodiment of FIG. 1. However, the embodiment of FIGS. 8 and 9 has a constraining element 802, rather than the constraining element 120 of FIG. 1. Also, this embodiment has a PCB 804 with a planar surface 806, to which constraining element 802 is bonded. FIG. 9 shows constraining element 802 provided with holes or perforations 902. Holes 902 are respectively positioned with respect to corresponding solder balls 116 of BGA 202, so that each hole 902 can be traversed by its corresponding ball 116.

As described above, stress related to CTE at different locations of a PCB surface such as 806, which is in contact with respective solder balls 116 of BGA 202, is lowest at a neutral axis 808. FIGS. 8 and 9 show neutral axis 808 passing through the center of BGA 202 and PCB surface 806. Stress increases progressively in moving along the X-axis in either direction from axis 808, that is, either toward the right edge or left edge of BGA 202, as viewed in FIGS. 8 and 9.

The above characteristic of CTE related stress, across BGA 202 and PCB surface 806, is used in constructing the constraining element 802. More particularly, since the stress is less at the center of the BGA than at the edges, the strength provided by the constraining element to oppose the stress must be greater at the edges than at the center, and must change progressively therebetween. To achieve this, the thickness of constraining element, that is, its dimension along the Y-axis as viewed in FIG. 8, is selectively varied along the X-axis. The strength of constraining element 802 increases as its thickness increases. Thus, the thickness of element 802 is smallest at its center, proximate to axis 808, and progressively increases along the X-axis to its edges. Thus, the thickness of constraining element 802 proximate to BGA ball 116j is greater than the thickness thereof proximate to BGA ball 116i.

In a modification of the above embodiments, a space equal to the thickness of the constraining element could be milled or routed in the PCB surface, before the BGA and IC device were placed thereon. The constraining element would then be placed into the space, and the PCB surface would remain flat and coplanar.

Figure 10:
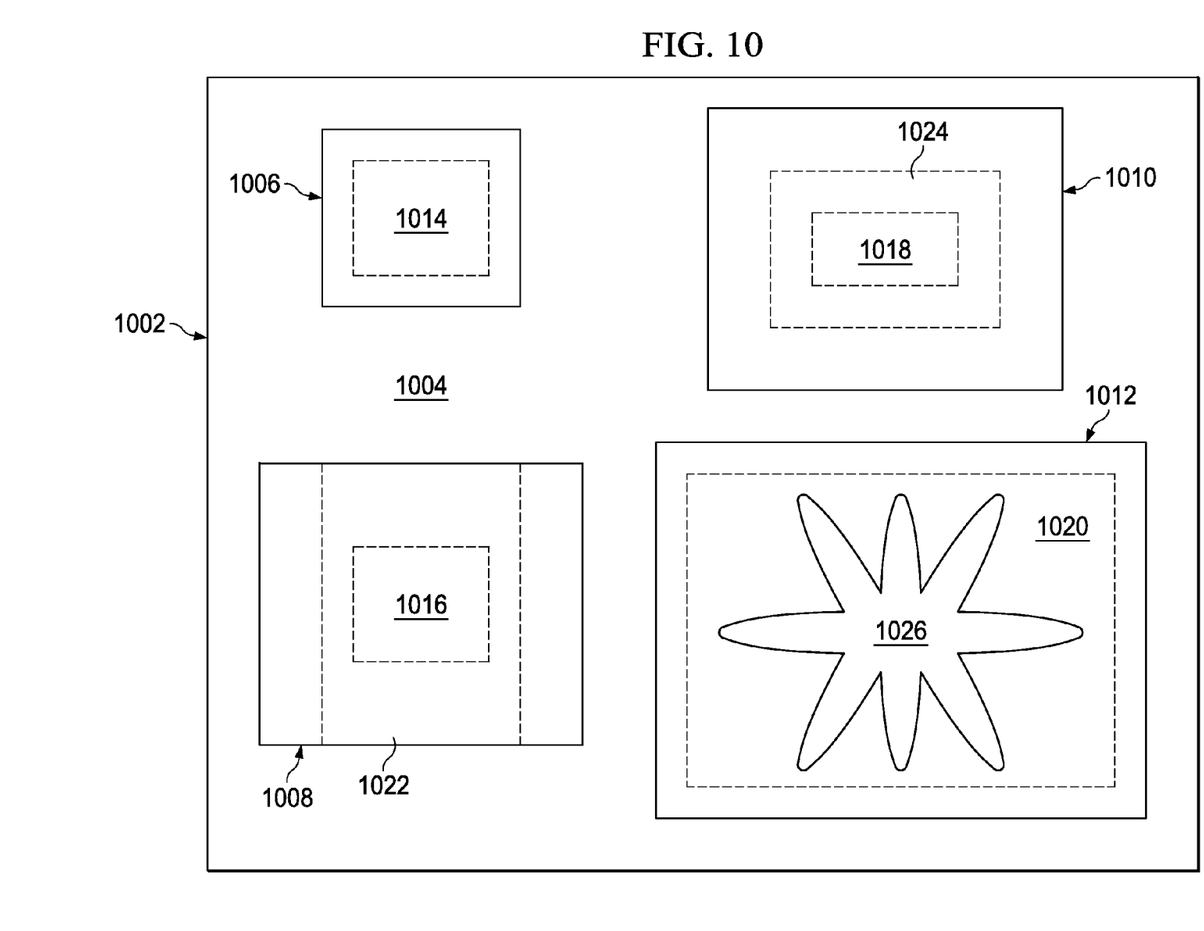
FIG. 10 is a schematic view showing a further embodiment of the invention.

Referring to FIG. 10, there is shown a PCB or carrier module 1002 having a surface 1004, wherein multiple IC components 1006-1012 comprising packages, chips or devices of varying types and sizes are each bonded to surface 1004. More particularly, components 1006-1012 are attached to surface 1004 by BGAs 1014-1020, respectively. However, component 1006 is comparatively small, and thus does not have a significant amount of stress during the soldering process.

Each of the IC components 1008-1012 is furnished with a constraining element comprising an embodiment of the invention. Each of these components is thus adapted to independently deal with the stresses produced during the soldering process. Components 1008 and 1010 may be provided with constraining elements 1022 and 1024, for example, which both comprise the embodiment of FIG. 1. Component 1020 is provided with a constraining element 1026 comprising the embodiment of FIG. 7.

FIG. 10 thus illustrates the diversity with which multiple embodiments of the invention may be used on a conventional carrying or support platform.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An integrated circuit (IC) mounting assembly comprising:
   an IC device having a first planar surface, wherein multiple electrically conductive first terminals are located at said first surface;
   a mounting platform having a second planar surface in closely spaced relationship with said first surface, wherein multiple electrically conductive second terminals are located at said second surface, each second terminal corresponding to one of said first terminals;
   a solder element extending between each first terminal and its corresponding second terminal; and
   a constraining element rigidly joined to said second surface, wherein the constraining element has a coefficient of thermal expansion (CTE) which is selectively less than the CTE of the mounting platform at said second surface, the constraining element is provided with a number of holes, and each hole is traversed by the solder element extending between the first terminal and its corresponding second terminal.

2. The mounting assembly of claim 1, wherein:
the value of the CTE of the constraining element is selected to comprise a negative CTE value.

3. The mounting assembly of claim 1, wherein:
said first surface of the IC device has an associated first CTE value, the mounting platform at said second surface has an associated second CTE value, and the CTE of the constraining element is selected so that the constraining element interacts with the mounting platform to provide a resultant CTE value at said second surface, wherein the difference between said resultant CTE value and said first CTE value is less than the difference between said second CTE value and said first CTE value.

4. The mounting assembly of claim 1, wherein:
said resultant CTE value is approximately equal to said first CTE value.

5. The mounting assembly of claim 1, wherein:
multiples of the solder element comprise respective solder balls of a ball grid array (BGA), and the support platform comprises a printed circuit board (PCB).

6. The mounting assembly of claim 1, wherein:
the constraining element is fabricated from a material selected from a group that includes at least invar, kevlar, tungsten, molybdenum, and a specified alloy of iron, cobalt and nickel.

7. The mounting assembly of claim 1, wherein:
multiples of the solder elements and said second terminals collectively define four corners and a center point of a rectangle located on said second surface of the mounting platform, and the constraining element includes a first strip that extends through the center point between two opposing corners of the rectangle, and further includes a second strip that extends through the center point between two other opposing corners of the rectangle.

8. The mounting assembly of claim 1, wherein:
said solder elements and said second terminals collectively define a rectangle located on said second surface that has a central axis and opposing edges, the constraining element is positioned to overlay said rectangle, and the constraining element has the capability to oppose stress in said second surface wherein said capability increases in moving along the constraining element from a location proximate to said central axis to a location proximate to either one of said opposing edges.

9. The mounting assembly of claim 8, wherein:
the constraining element has a thickness dimension, and said thickness increases progressively in moving from a location proximate to said central axis to a location proximate to either of said opposing edges.

10. The mounting assembly of claim 1, wherein:
each of said holes is sufficiently large to ensure that the solder element transversing a hole avoids contact with the constraining element.

11. The mounting assembly of claim 1, wherein:
the constraining element is joined to said second surface of the mounting platform by means of a selected adhesive.

12. The mounting assembly of claim 1, wherein:
the IC device is one of a plurality of IC components that are each joined to said second surface of the mounting platform, and the constraining element is one of a plurality of similar constraining elements that are each positioned between said second surface and one of the IC components of said plurality.

13. In association with an IC device that has a first coefficient of thermal expansion (CTE) and a first planar surface with multiple electrically conductive first terminals, a solder element initially attached to each first terminal, and a mounting platform having a second CTE and a second planar surface with multiple electrically conductive second terminals, a method comprising the step of:

forming holes through a constraining element that has a CTE and is fabricated from a material, wherein the holes are respectively positioned to match the locations of corresponding second terminals of said second surface;

rigidly bonding the constraining element to said second surface, so that the constraining element and the mounting platform form a combined structure that has a resultant CTE, and the CTE of the constraining element is selected so that the resultant CTE has an intended relationship to the first CTE of the IC device;

positioning the IC device so that each solder element is inserted through one of said holes in the constraining element into contact with one of said second terminals; and selectively applying heat and cooling in order to bond each solder element to its contacting second terminal.

14. The method of claim 13, wherein:
the resultant CTE is approximately equal to the first CTE of the IC device.

15. The method of claim 13, wherein:
the material selected for the constraining element has substantial mechanical strength.

16. The method of claim 13, wherein:
multiples of the solder element comprise respective balls of a ball grid array, the mounting platform comprises a printed circuit board, and the constraining element is bonded to the second surface by means of epoxy.

17. A method for mounting an IC device having a first planar surface with multiple electrically conductive first terminals on a mounting platform having a second planar surface with multiple electrically conductive second terminals, the method comprising the steps of:

attaching a solder element to each of said first terminals;

rigidly joining a constraining element formed of a mechanically strong material to said second surface, wherein the constraining element has a coefficient of thermal expansion (CTE) which is selectively less than the CTE of the mounting platform at said second surface, the constraining element is provided with a number of holes, and each hole corresponds to the solder element attached to one of said first terminals;

positioning the IC device so that the solder element inserted through one of said holes in the constraining element, is in contact with a corresponding one of said second terminals; and selectively applying heat and cooling to bond the solder element to its contacting second terminal.

18. The method of claim 17, wherein:
said solder elements and said second terminals collectively define four corners and a center point of a rectangle located on said second surface of the mounting platform, and the constraining element includes a first strip that extends through the center point between two opposing corners of the rectangle, and further includes a second strip that extends through the center point between two other opposing corners of the rectangle.

19. The method of claim 17, wherein:
said solder elements and said second terminals collectively define a rectangle located on said second surface that has a central axis and opposing edges, the constraining element is positioned to overlay said rectangle, and the constraining element has the capability to oppose stress in said second surface, wherein said capability increases in moving along the constraining element from a location proximate to said central axis to a location proximate to either one of said opposing edges.

20. The method of claim 19, wherein:
the constraining element has a thickness dimension, and said thickness dimension increases progressively in moving from a location proximate to said central axis to a location proximate to either of said opposing edges.

* * * * *